(12) United States Patent
Libres et al.

(10) Patent No.: US 7,550,856 B2
(45) Date of Patent: Jun. 23, 2009

(54) GROOVED SUBSTRATES FOR UNIFORM UNDERFILLING SOLDER BALL ASSEMBLED ELECTRONIC DEVICES

(75) Inventors: Jeremias P. Libres, Garland, TX (US); Joel T. Medina, Baguio (PH); Mary C. Miller, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 309 days.

(21) Appl. No.: 11/364,946

(22) Filed: Mar. 1, 2006

(65) Prior Publication Data

US 2007/0054506 A1  Mar. 8, 2007

Related U.S. Application Data

(62) Division of application No. 10/933,784, filed on Sep. 3, 2004, now Pat. No. 7,033,864.

(60) Provisional application No. 60/177,446, filed on Sep. 13, 2004.

(51) Int. Cl.
*H01L 23/48* (2006.01)

(52) U.S. Cl. ............... 257/777; 257/778; 257/E21.503; 257/E21.511; 257/E23.069; 257/E27.161

(58) Field of Classification Search ............... 438/108, 438/612, 613; 257/778, E21.503, E1.511, 257/777, E23.069, E27.161
See application file for complete search history.

(56) References Cited

U.S. PATENT DOCUMENTS 6,144,101 A * 11/2000 Akram ................. 257/778
6,228,680 B1    5/2001 Thomas
6,288,451 B1 *  9/2001 Tsao ..................... 257/778
6,365,441 B1    4/2002 Raiser et al.
6,391,682 B1 *  5/2002 Tsai et al. ............ 438/108
6,455,878 B1 *  9/2002 Bhat et al. ............ 257/99
6,617,687 B2 *  9/2003 Akram et al. .......... 257/737
6,660,560 B2   12/2003 Chaudhuri et al.
6,724,091 B1    4/2004 Jayaraman et al.
6,773,958 B1    8/2004 Wang
6,774,493 B2    8/2004 Capote et al.

OTHER PUBLICATIONS

Dr. Ken Gilleo, "The Chemistry & Physics of Underfill" Tutorial document.
Jinlin Wang, "Underfill of Flip Chip on Organic Substrate: Viscosity, Surface Tension, and Contact Angle" Microelectronics Reliability, 42. pp. 293-299. 2002.

* cited by examiner

*Primary Examiner*—Brook Kebede
(74) *Attorney, Agent, or Firm*—Yingsheng Tung; Wade J. Brady, III; Frederick J. Telecky, Jr.

(57) ABSTRACT

A semiconductor assembly (300) comprising a semiconductor device (301), which has a plurality of metallic contact pads (302) and an outline by sides (303). A metallic bump (304) made of reflowable metal is attached to each of these contact pads. An electrically insulating substrate (305) has a surface with a plurality of metallic terminal pads (306) in locations matching the locations of the device contact pads, and further a plurality of grooves (310) and humps (311) distributed between the terminal pad locations, complementing the distribution of the terminal pads. Each bump is further attached to its matching terminal pad, respectively; the device is thus interconnected with the substrate and spaced apart by a gap (320). Adherent polymeric material (330) containing inorganic fillers fills the gap substantially without voids.

8 Claims, 5 Drawing Sheets

US 7,550,856 B2

GROOVED SUBSTRATES FOR UNIFORM UNDERFILLING SOLDER BALL ASSEMBLED ELECTRONIC DEVICES

This is a divisional application of application Ser. No. 10/933,784 filed Sep. 3, 2004 now U.S. Pat. No. 7,033,864, which claims the benefit of provisional application No. 60/177,446 filed Sep. 13, 2004, the contents of which are herein incorporated by reference in its entirety.

FIELD OF THE INVENTION

The present invention is related in general to the field of electronic systems and semiconductor devices and more specifically to structure and method of void-free underfilling the gap of flip-chip electronic assemblies.

DESCRIPTION OF THE RELATED ART

It is well known in the so-called flip-chip technology how to mount an integrated circuit chip to a printed circuit substrate by solder bump interconnections. After the assembly process, the integrated circuit chip is spaced apart from the printed circuit substrate by a gap. The solder bump interconnections extend across the gap and connect contact pads on the integrated circuit chip to terminal pads on the printed circuit substrate to attach the chip and then conduct electrical signals, power and ground potential to and from the chip for processing. Similarly, after packaged semiconductor devices of the ball grid array families have been assembled to motherboards by means of solder bumps connections, the bumps define a gap between the packaged device and the board.

There is a significant difference between the coefficient of thermal expansion (CTE) between the semiconductor material used for the chip and the material typically used for the substrate; for instance, with silicon as the semiconductor material and plastic FR-4 as substrate material, the difference in CTE is about an order of magnitude.

As a consequence of the CTE difference, mechanical stresses are created when the assembly is subjected to thermal cycling during use or testing. These stresses tend to fatigue the solder bump interconnections, resulting in cracks and thus eventual failure of the assembly. In order to strengthen the solder joints without affecting the electrical connection, the gap is customarily filled with a polymeric material (containing inorganic fillers), which encapsulates the bumps and fills any space in the gap between the semiconductor chip and the substrate. For examples, in the well-known "C-4" process developed by the International Business Machines Corporation, viscous polymeric precursors are used to fill the space in the gap between the silicon chip and the ceramic substrate (see also IBM J. Res. Develop., vol. 13, pp. 226-296, 1969).

The polymeric precursor, sometimes referred to as "underfill", is typically applied after the solder bumps are reflowed to bond the semiconductor device to the substrate. The underfill is dispensed onto the substrate adjacent to the chip and is pulled into the gap by capillary forces. Thereafter, the precursor is heated, polymerized and "cured" to form an encapsulant. These approaches become increasingly insufficient as the number of bump interconnections increases and the bump size and the bump center-to-center pitch shrink. With these trends, the number of voids in the underfill and the risk of clustering the fillers in the precursor increase sharply.

SUMMARY OF THE INVENTION

A need has therefore arisen for an assembly methodology, material preparation and fabrication technique that provide not only stress-free, but also void-free underfilling. The methodology is based on the careful control of the parameters determining the phenomenon of capillarity.

One embodiment of the present invention is a semiconductor assembly comprising a semiconductor device, which has a plurality of metallic contact pads and an outline by sides. A metallic bump made of reflowable metal is attached to each of these contact pads. An electrically insulating substrate has a surface with a plurality of metallic terminal pads in locations matching the locations of the device contact pads, and further a plurality of grooves and humps distributed between the terminal pad locations, complementing the distribution of the terminal pads. Each bump is further attached to its matching terminal pad, respectively; the device is thus interconnected with the substrate and spaced apart by a gap. Adherent polymeric material containing inorganic fillers fills the gap substantially without voids.

In some embodiments, the grooves and humps form rows approximately parallel to the sides of the device; some embodiments also have grooves and humps distributed around the device outline so that the polymeric material forms a substantially uniform meniscus around the outline.

Another embodiment of the invention is a method for fabricating a semiconductor assembly, wherein a plurality of grooves and humps are formed in the surface of an electrically insulating substrate so that they are distributed between a plurality of terminal pad locations. A semiconductor device with contact pads matching those terminal pads, and outlined by sides, is connected to the substrate by means of reflow bumps so that a gap is formed, spacing device and subs-rate apart. A quantity of adherent, viscous polymer is deposited at one of the chip sides so that the polymer is pulled into the gap by capillary action. This capillary action is controlled by the plurality of grooves and humps so that the capillary flow of the polymer progresses in a substantially linear front along through the gap. Time and temperature are controlled during the capillary flow to maintain the about linear progression front until the gap is filled with polymer, substantially without voids.

It is a technical advantage of the invention that the assembly process is simple and low-cost, applicable to large-chip semiconductor products, high numbers and small size of bumps, and fine bump pitch. At the same time, the method is flexible and can be applied to a wide spectrum of material and process variations, leading to improved semiconductor device reliability.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1A:
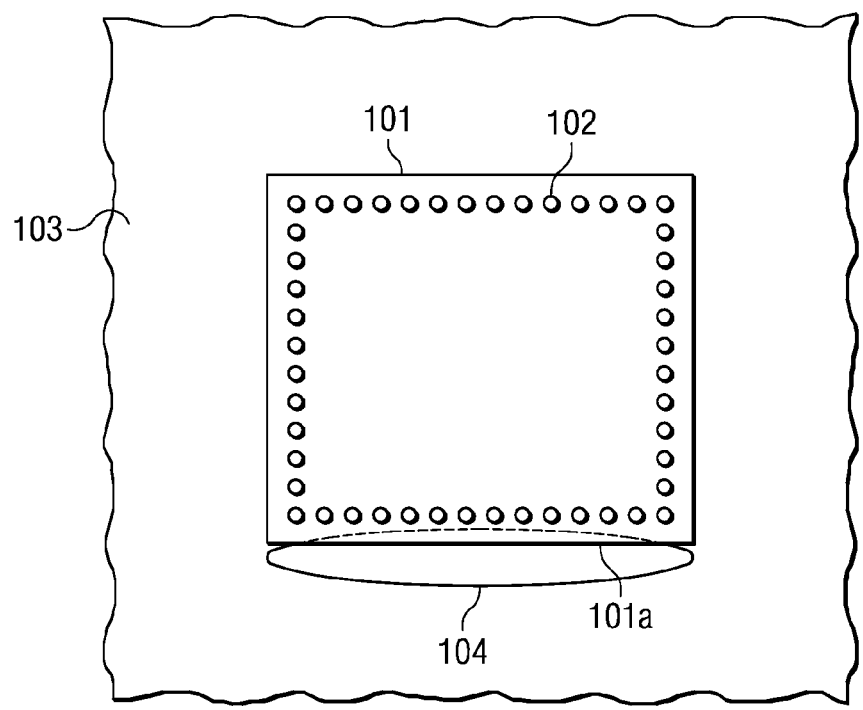
FIG. 1A is a schematic X-ray top view of a semiconductor device attached to a substrate with a quantity of underfill material dispensed at one device side in known technology.
Figure 1B:
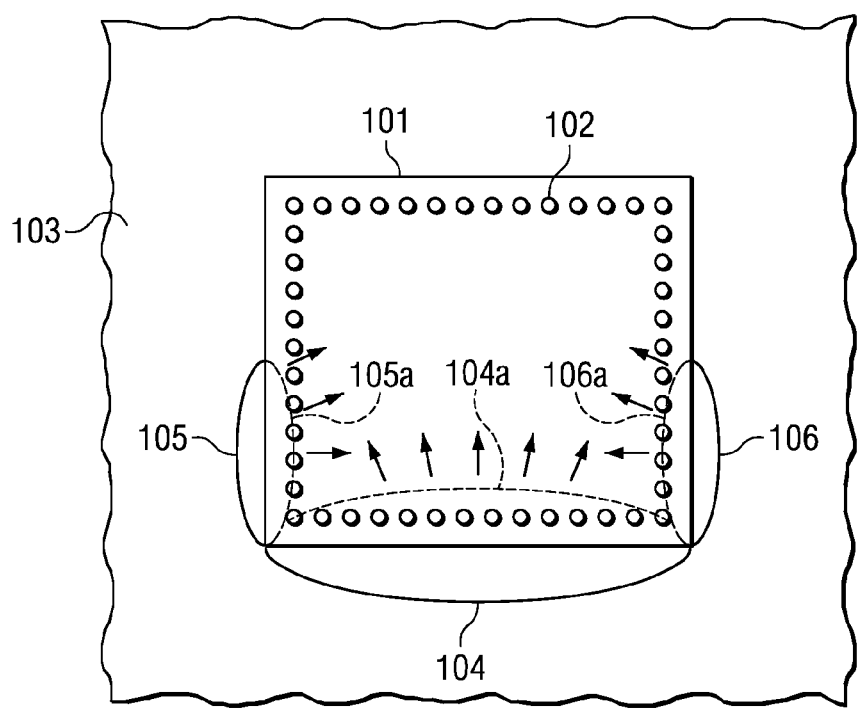
FIG. 1B is a schematic X-ray top view of a semiconductor device attached to a substrate, illustrating the progression of filling the gap between device and substrate with a liquid under material in known technology.

The impact of the present invention can be most easily appreciated by highlighting the shortcomings of the known technology. As a typical example of the known technology, the schematic top views of FIGS. 1A and 1B illustrate an assembly of a semiconductor chip 101 with rows of solder connections 102 around the chip perimeter onto a substrate 103. FIG. 1A shows in X-ray fashion the flip-assembled chip 101 attached to substrate 103; the solder connections 102 between chip 101 and substrate 103 create a gap. A quantity of liquid, viscous polymeric material 104 is deposited along chip side 101a for filling this gap; capillarity pulls the polymer into the gap and provides the mechanism for filling.

Capillarity is the capillary action by which the surface of a liquid, where it contacts a solid, is elevated or depressed, because of the relative attraction of the molecules of the liquid for each other and for those of the solid. Capillary attraction is the force of adhesion existing between a solid and a liquid in capillarity.

Capillary action becomes effective, when a positive force of adhesion exists between the wettable solid surface of a capillary tube or gap, and a wetting liquid inside the tube or gap ("capillary attraction"). In an approximately horizontal tube or gap, the pulling force moves the liquid along the tube or gap.

FIG. 1B illustrates the problematic behavior of the liquid polymeric material 104 in known technology. While a portion 104a is being pulled into the chip-to-substrate gap, other portions 105 and 106 flow along adjacent sides of the chip and start from different angles, as portions 105a and 106a, to be pulled into the gap. The arrows in FIG. 1B indicate schematically this complex situation. As a consequence, the merging of the fronts from different angles slows down the effective progression front and has the substantial risk of trapping air pockets along the progression, which may cause capture voids and failures towards the exit side. Analogous difficulties arise when 101 represents a packaged semiconductor device in FIGS. 1A and 1B. These difficulties are resolved by the embodiments of the invention.

For the design of the equipment, the invention applies certain laws of fluid dynamics and deformable medium and extends them to complex conditions of semiconductor product fabrication.

For a deformable medium flowing in a gap having different cross sections c in various parts, continuity requires that the amount of deformable medium flowing per unit of time through each cross section is directly proportional to q and to the velocity v in this cross section:

$$qv = \text{const.}$$

In a gap, a deformable medium flows fastest at the smallest cross section.

The velocity v of the flowing medium of density $\rho$ is correlates to its pressure p after BERNOULLI by $$\tfrac{1}{2}\rho v^2 + p = \text{const.}$$

The pressure of a flowing medium is the smaller the greater its velocity is. Consequently, the pressure at the smaller cross sections is smaller than at the larger cross sections.

When the parts of the gap with different cross sections are separated by different lengths l of the gap, one also has to consider the drop of pressure along the gap lengths; the drop, in turn, depends on the characteristics of the flow, laminar versus turbulent.

A deformable medium flowing in a portion of a gap of radius r and length l at a velocity v, averaged over the gap portion cross section, experiences a pressure drop $\Delta p$ due to friction. For idealized conditions, such as neglecting the inertia of the flowing medium, HAGEN and POISEUILLE have found for laminar flow $$\Delta p = 8\eta l v / r^2.$$

($\eta$ = dynamic viscosity)

The pressure drop of the medium along the gap portion length is directly proportional to the first power of the average velocity and inverse proportional to the second power of the portion radius.

In contrast, for turbulent flow the relationship is $$\Delta p = \rho \lambda l v^2 / r.$$

($\rho$ = density, $\lambda$ = dimensionless number related to REYNOLD's criteria of transition from laminar to turbulent flow).

The pressure drop of the medium along the gap portion length is directly proportional to the second power of the average velocity and inverse proportional to the first power of the portion radius.

Figure 2:
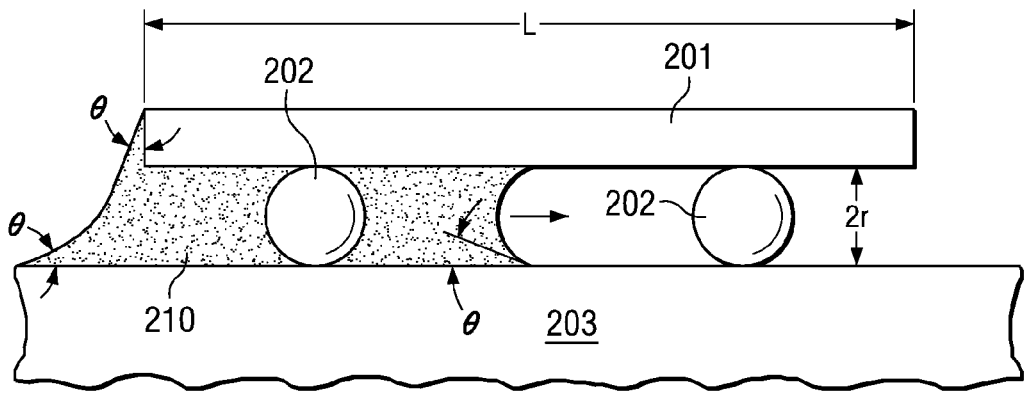
FIG. 2 is a schematic cross section of a chip attached by solder bumps to a substrate, illustrating the capillary action of filling the gap with a liquid material.

FIG. 2 illustrates the flow-out time t as a function of the capillary conditions in the gap of width 2r (determined by the height 2r of the solder connections 202) between chip 201 and substrate 203.

$$t = (3\eta / \gamma \cos \Theta)(l^2 / 2r)$$

($\gamma$ = surface tension)
($\Theta$ = contact angle)

The flow-out time is directly proportional to the square of the flow distance and inverse proportional to the capillary width (after J. WANG, Microelectr. Reliab. 42, 293-299, 2002). The equation is only approximately correct and does not comprehend the time dependence of material parameters. FIG. 2 also shows the meniscus 210 of the filler at the side edge of chip 201; it is also characterized by contact angles Θ. Analogous considerations hold, when 201 in FIG. 2 is a semiconductor device.

Figure 3:
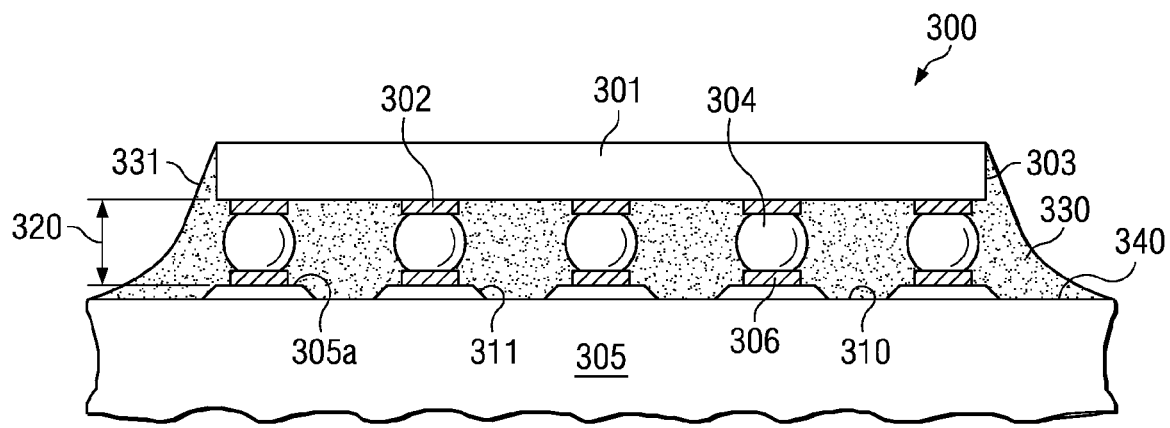
FIG. 3 is a schematic cross section of an embodiment of the invention showing a semiconductor device attached by solder bumps to a substrate, the gap filled with a filling material, wherein the substrate surface has a plurality of trenches and humps according to the invention.
Figure 4:
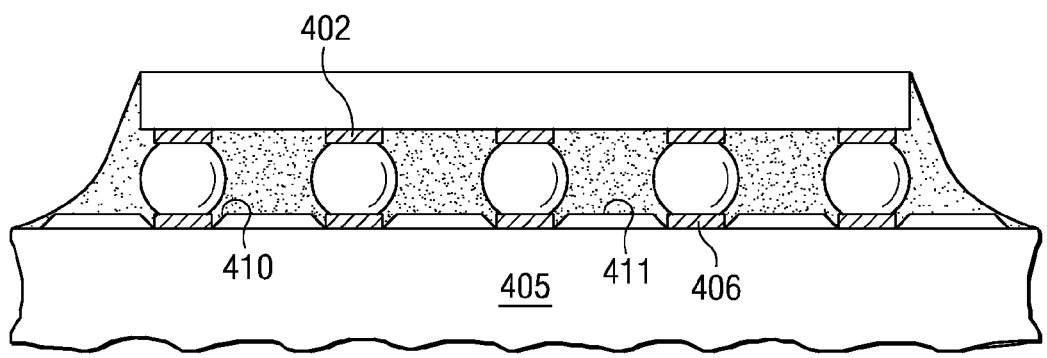
FIG. 4 is a schematic cross section of another embodiment of the invention showing a semiconductor device attached by solder bumps to a substrate, the gap filled with a filling material, wherein the substrate surface has a plurality of trenches and humps according to the invention.

FIGS. 3 to 6 show schematic cross sections of embodiments of the inventions, in which the capillary action is controlled for achieving a substantially uniform and void-free underfilling process. FIG. 3 is a schematic cross section of a semiconductor assembly, generally designated 300, which comprises a semiconductor device 301 with a plurality of metallic contact pads 302; the device has an outline determined by sides 303. Device 301 may be a semiconductor chip or a semiconductor package. A metallic bump 304 is attached to each contact pad 302; the bumps are preferably made of reflowable metal such as tin or tin alloy solder.

Assembly 310 further comprises an electrically insulating substrate 315 with a surface 305a. On surface 305a is plurality of metallic terminal pads 306 in locations, which match the locations of the device contact pads 302. Furthermore, on surface 305a are a plurality of grooves 310 and humps 311, which are distributed between terminal pads 306. In FIG. 3, terminal pads 306 are located on humps 311, and grooves 310 are between the terminal pad locations.

In other embodiments, there are different arrangements of grooves and humps. As an example, in the embodiment illustrated in the schematic cross section of FIG. 4, substrate 405 has a plurality of grooves 410 and humps 411. The terminal pads 406 of substrate 405, which match the location of the device contact pads 402, are located in grooves 410, and the humps 411 are between the terminal pad locations.

Referring to FIG. 3, reflow bumps 304 are also attached to the respective matching terminal pads 306. Consequently, device 301 is interconnected to substrate 305 and spaced apart by gap 320. By the underfilling process step, gap 320 is filled with an adherent polymeric precursor 330, which also contains inorganic filler particles to enhance its mechanical characteristics after polymerization and lower the coefficient of thermal expansion of the polymerized material. Precursor 330 forms a substantially uniform meniscus 331 around the outline of the interconnected device. During the underfilling step with the polymer precursor, grooves 310 act to stabilize and equalize the capillary action, thus creating a more or less linear progression front of the moving precursor. As a consequence of the about linear progression front, gap 320 is filled substantially without voids.

FIG. 3 also indicates grooves 340 in substrate surface 305a outside the sides 303 of device 301. Grooves 340 are distributed approximately perpendicular to the device outline and act to slow the polymer flow along the device sides 303 and thus to enhance the uniformity of the capillary action in the gap 320.

Figure 5:
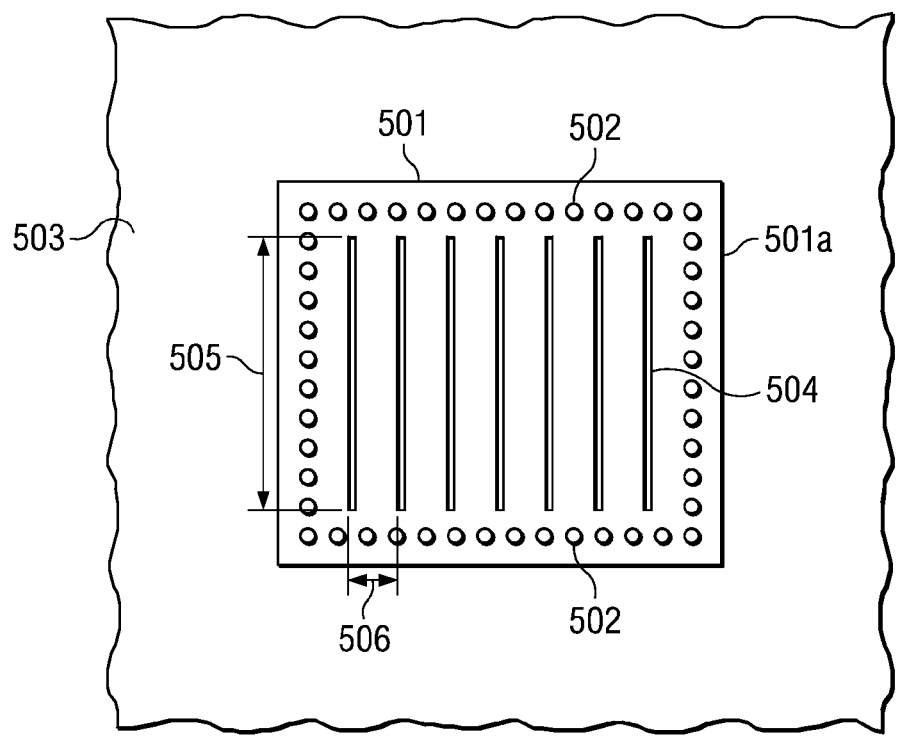
FIG. 5 is a schematic X-ray top view of an embodiment of the invention illustrating detail of a plurality of grooves and humps in the substrate.

For some device types, it is advantageous to arrange the grooves and humps in substrate surface in simple patterns. As an example, FIG. 5 depicts a top view X-ray through a chip 501 with the solder bump connections 502 to substrate 503 aligned the chip perimeter. For this distribution of the solder connections, the capillary action during the underfilling step can be controlled by a plurality of grooves and humps 504 arranged in rows approximately parallel to the sides 501a of the chip.

Furthermore, it is an advantage in this example to provide the grooves and humps continuous over the length 505, which is about the length of the chip. It is an additional advantage to the space the grooves an humps approximately uniformly (spacing designated 506 in FIG. 5).

Improved control of the capillary action in underfilling process can also be obtained for semiconductor packages, which are bump-attached to substrates with grooves and humps according to the invention; analogous distributions of grooves and humps on the substrate surface, as described above, have proved to be successful.

Figure 6:
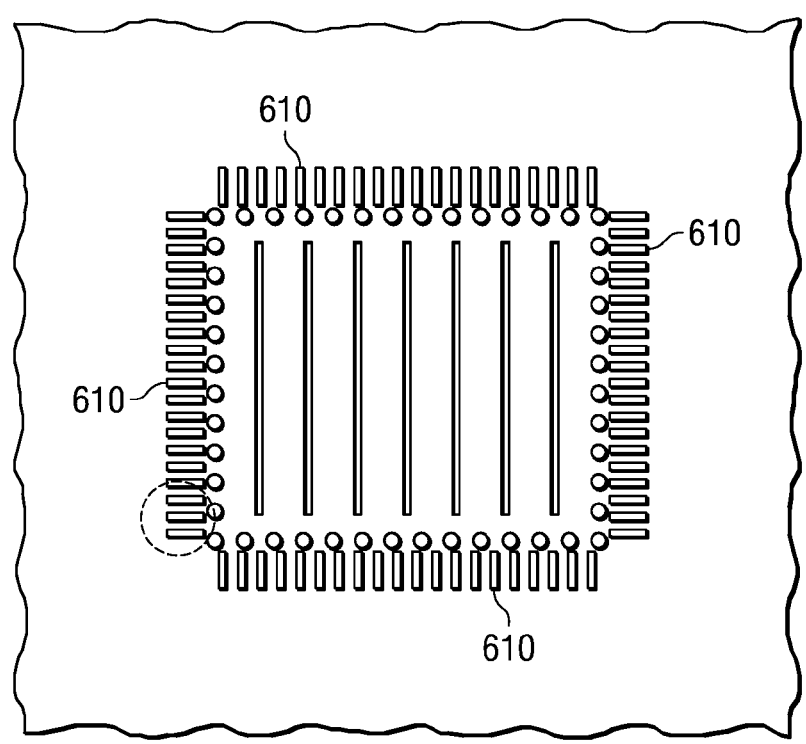
FIG. 6 is a schematic X-ray top view of another embodiment of the invention illustrating an additional plurality of grooves and humps in the substrate.

In the top view X-ray of FIG. 6, an additional plurality 610 of grooves and humps in the substrate is distributed around the device outline. Numerous and relatively short, these grooves and humps are oriented at an about right angle to the device outline; they serve to slow the unwanted flow of polymer material along the sides of the device and thus contribute to achieve an about linear gap filling material progression.

Figure 7A:
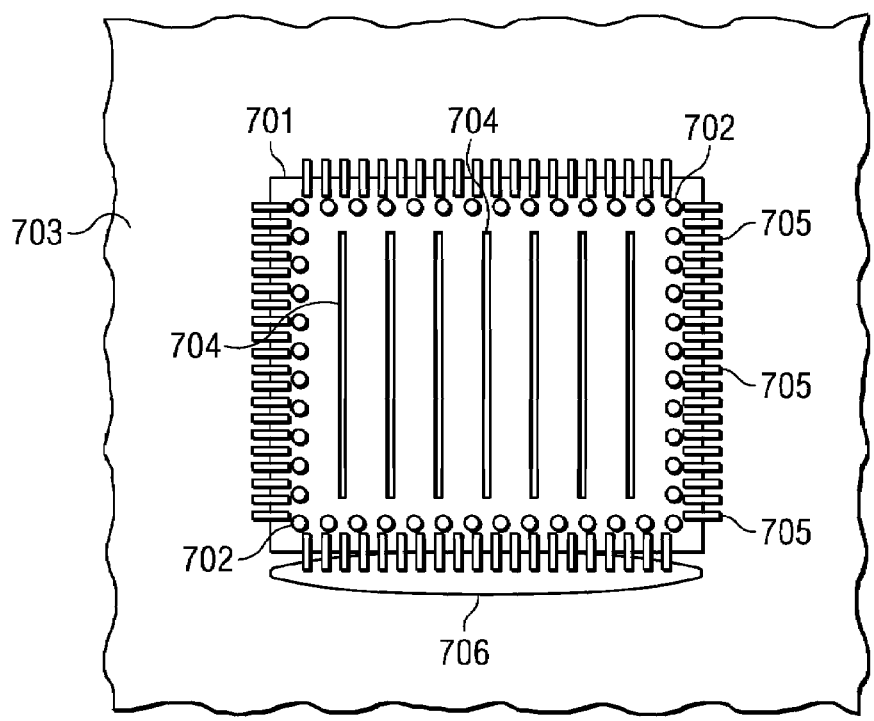
FIG. 7A is a schematic X-ray top view of an embodiment of the invention on showing a semiconductor device attached to a substrate, with a quantity of underfill material dispensed at one device side, the substrate having pluralities of grooves and humps.
Figure 7B:
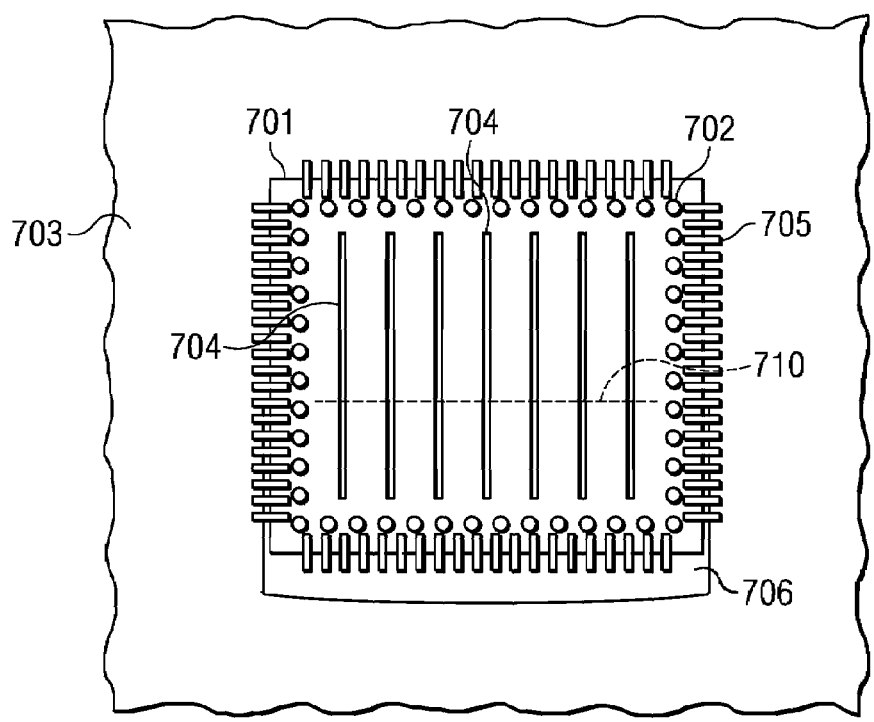
FIG. 7B is a schematic X-ray top view of a semiconductor device attached to a substrate with grooves and humps, illustrating the progression of polymer material in filling the gap between device and substrate according to the invention.

As examples, the schematic top X-ray views of FIGS. 7A and 7B illustrate the success of the substrate grooves and humps in achieving a controlled, almost linear polymer progression through the gap between the assembled semiconductor chip and the substrate. FIG. 7A shows, as an example, a chip 701 with contact pads 702 arranged around the perimeter assembled by solder bumps onto a substrate 703. The substrate has a first plurality 704 of grooves and humps about parallel to the chip sides and in about equal distances almost through the whole length of the chip. In addition, a second plurality 705 of grooves and humps in the substrate, at right angle to the chip outline, surrounds the chip. A quantity of polymer precursor 706 has been dispensed along one side of the chip.

FIG. 7B illustrates the effect on the capillary action of the pluralities of contours in the substrate. The progression of the polymer precursor 706 through the gap is approximately a straight line 710. The precursor at the chip sides (711) does not run ahead, but rather participates in the straight-line progression of the filling front.

Similar improved control of the capillary action in the underfilling processes has been obtained when semiconductor packages, such as ball grid array packages, are assembled on substrates, which have grooves and humps in a distribution similar to FIGS. 7A and 7B.

Figure 8:
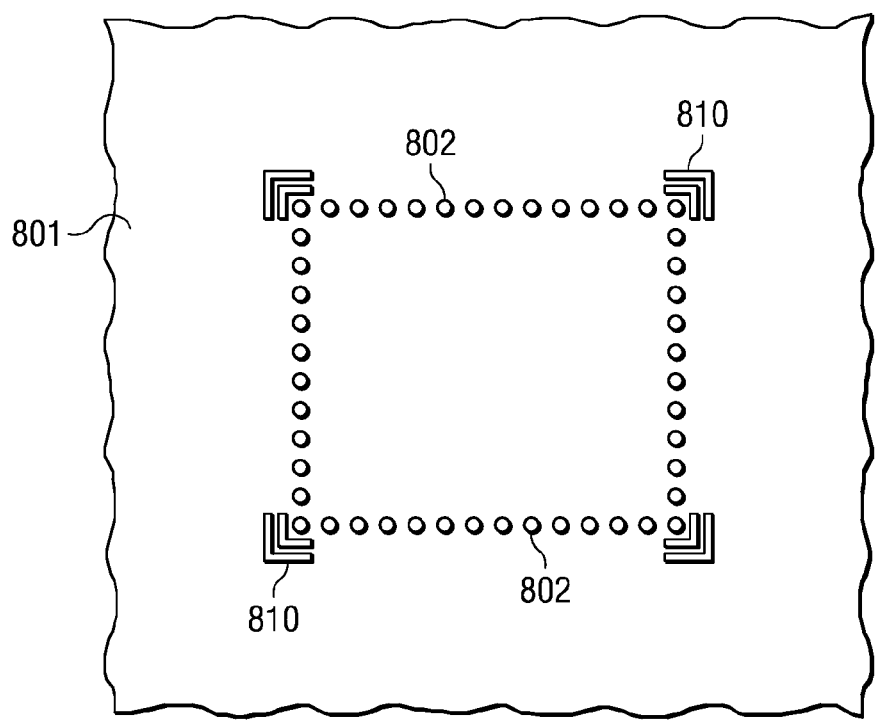
FIG. 8 is a schematic top view of a substrate with grooves and humps according to another embodiment of the invention.

Another embodiment of the invention is shown in FIG. 8, which illustrates a schematic top view of an electrically insulating substrate 801. Metallic terminal pads 802 are placed to receive solder connections for attaching a semiconductor device (not shown in FIG. 8). The polymer precursor for filling the gap between substrate 801 and the device should preferably form a well-defined meniscus at the outline of the device, similar to the schematic cross section of FIG. 3. The couple of trenches (or dams) 810 at each assembly corner in FIG. 8 are designed to control the precursor flow especially at the assembly corners so that the precursor meniscus will exhibit the desired width and contours. Irregular extensions or outlines of the meniscus are thus prevented, the area required by the meniscus is controlled, and the cosmetic look of the finished product improved.

Figure 9:
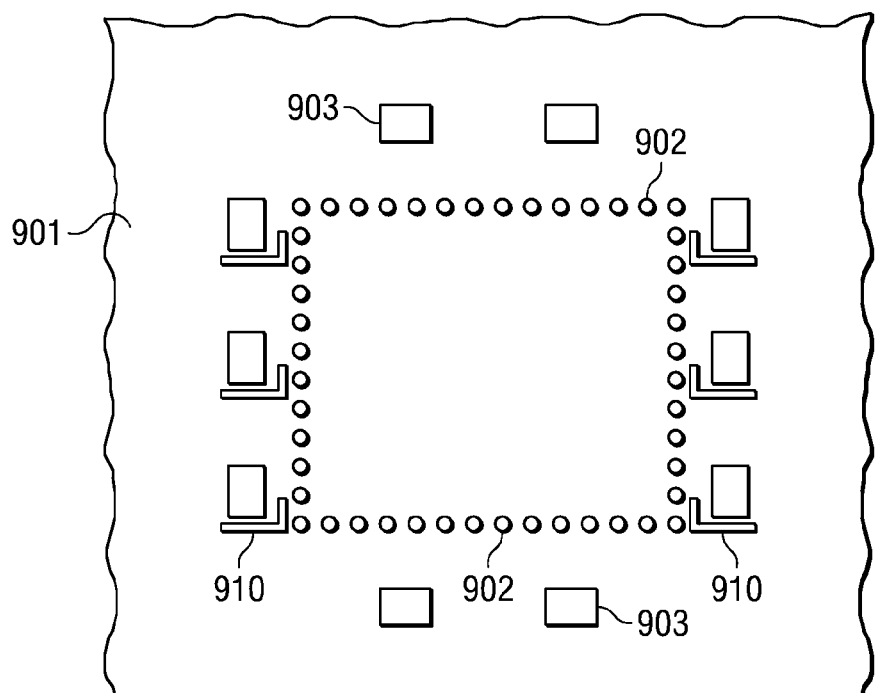
FIG. 9 is a schematic top view of a substrate with grooves and humps according to yet another embodiment of the invention, the substrate further having metal pads for attaching chip capacitors.

FIG. 9 depicts another embodiment of the invention, in which the control of the capillary flow of polymer precursor provides a positioning of capacitors in close proximity to the semiconductor device and thus contributes to save precious assembly real estate. FIG. 9 shows in schematic top view an insulating substrate 901 with metal pads 902 for terminals and metal pads 903 for chip capacitors. 910 are barriers, or flow channels, for controlling the polymer precursor flow in the proximity of the device-to-be-assembled. AS a result of this control, the chip capacitors can be positioned in closer proximity to the assembled central device than known technology permits, thus saving assembly area.

Another embodiment of the invention is a method for fabricating a semiconductor assembly. In the method, a semiconductor device is provided, which has a plurality of metallic contact pads and is outlined by sides. The device may be a semiconductor chip, or may be a semiconductor package. A reflow bump, such as a solder ball, is attached to each of the contact pads. Further, the method provides an electrically insulating substrate, which has a surface and a plurality of metallic terminal pads in locations matching the locations of the chip contact pads.

In the substrate surface is a plurality of grooves and humps formed so that they are distributed between the terminal pad locations. Preferred methods for forming the grooves and humps are etching, laser action, or screen printing. The distribution of the grooves and humps complements the distribution of the reflow bumps in order to achieve an about equal rate of progression of the fill front over the whole front, when the gap of the assembled device is filled with a polymer precursor. Dependent on the positions of the reflow bumps, the complement of the grooves and humps includes a variation of orientation and depth. In general, the grooves and humps alternate between trenches and hillocks (dams, barriers), which are preferably shallow compared to the diameter of the reflow bumps. In this configuration, the grooves and humps affect the capillary flow locally by imposing an equalized capillary force on the flow and thus provide an about linear progression front.

The method continues by attaching the device to the substrate so that each reflow bump, which is attached to one of the chip contact pads, is also attached to its matching substrate terminal pad. A gap is thus created, which spaces the device and the substrate apart.

Next, a quantity of adherent, viscous polymer is deposited at one of the chip sides so that the polymer is pulled into the gap by capillary action. The polymer preferably includes inorganic filler particles (such as alumina or silica) selected to strengthen the polymerized polymer mechanically and reduce its coefficient of thermal expansion. The largest diameter of the filler particles is preferably less than approximately 30% of the gap, amplifying the regulating effect of the grooves and humps.

The capillary action is controlled by the plurality of grooves and humps so that the capillary flow of the polymer progresses in a substantially linear front along through the gap. In addition, the method controls time and temperature during the capillary flow in order to maintain the about linear progression front until the gap is filled with polymer, substantially without voids. By controlling the capillary are action, the method also creates a substantially uniform meniscus of polymer around the device sides. Finally, the polymer precursor is ready for polymerization ("curing").

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the method disclosed can be applied to void-free filling of gaps between any substrates or other external parts which are interconnected by spacing elements, when in one of the parts grooves or humps have been formed to control capillary action. The method can generally be applied to fabricate void-free fillings between solid parts, when one part has surface contours to control capillary action. It is, therefore, intended that the appended claims encompass any such modifications or embodiments.

We claim:

1. A semiconductor assembly comprising:
    a semiconductor device having a plurality of metallic contact pads and an outline by sides;
    a metallic bump attached to each of the contact pads, wherein the bumps are formed of a reflowable metal;
    an electrically insulating substrate having a surface, the surface having a plurality of metallic terminal pads in locations matching the locations of the contact pads, wherein the surface has a first set of grooves and bumps distributed between the terminal pad locations and a second set of grooves and humps distributed around the device outline;
    each of the bumps also attached to the matching terminal pads, respectively, wherein the device is interconnected with the substrate and spaced apart by a gap; and
    an adherent polymeric material filling the pap substantially without voids.

2. The assembly according to claim 1, wherein the first set of grooves and humps form rows approximately parallel to two opposing sides of the sides of the device.

3. The assembly according to claim 2, wherein the rows are positioned so that the substrate terminal pads are located all in the grooves or all on the bumps.

4. The assembly according to claim 1, wherein the first set of groves and humps are continuous for about the length of the device.

5. The assembly according to claim 1, wherein the first set of groves and humps are approximately uniformly spaced.

6. The assembly according to claim 1, where in the polymeric material forms a substantially uniform meniscus around the outline of the interconnected device.

7. The assembly according to claim 1, where in the device is a semiconductor chip.

8. The assembly according to claim 1, wherein the first set of grooves each has a substantially float bottom surface.

* * * * *